United States Patent
Simonson et al.

(10) Patent No.: US 11,474,581 B2
(45) Date of Patent: Oct. 18, 2022

(54) COMMUNICATION TERMINAL FOR HOT-SWAP CONTROLLERS

(71) Applicant: Analog Devices International Unlimited Company, Limerick (IE)

(72) Inventors: Joshua John Simonson, Sunol, CA (US); Jiong Xia, Fremont, CA (US)

(73) Assignee: Analog Devices International Unlimited Company, Limerick (IE)

( * ) Notice: Subject to any disclaimer, the term of this patent is extended or adjusted under 35 U.S.C. 154(b) by 264 days.

(21) Appl. No.: 16/536,914

(22) Filed: Aug. 9, 2019

(65) Prior Publication Data

US 2021/0041930 A1 Feb. 11, 2021

(51) Int. Cl.
*G06F 1/28* (2006.01)
*G01R 31/40* (2020.01)
(Continued)

(52) U.S. Cl.
CPC ............ *G06F 1/28* (2013.01); *G01R 31/40* (2013.01); *G06F 1/266* (2013.01); *G06F 1/30* (2013.01)

(58) Field of Classification Search
CPC ... G06F 1/26; G06F 1/266; G06F 1/28; G06F 1/263; G06F 1/30; G06F 1/3212; G06F 9/4418; G01R 31/40
See application file for complete search history.

(56) References Cited

U.S. PATENT DOCUMENTS 6,853,098 B1 * 2/2005 Jackson .................. H02J 1/001
307/85
8,278,997 B1 * 10/2012 Kim .......................... G06F 1/26
327/541
(Continued)

FOREIGN PATENT DOCUMENTS

CN 201499153 U 6/2010
CN 104283199 A 1/2015
(Continued)

OTHER PUBLICATIONS

"Walt Jung, In Op Amp Application Handbook, 2005, Science Direct, https://www.sciencedirect.com/topics/engineering/ideal-op-amp" (Year: 2005).*
(Continued)

*Primary Examiner* — Santosh R Poudel
(74) *Attorney, Agent, or Firm* — Schwegman Lundberg & Woessner, P.A.

(57) ABSTRACT

A hot-swap controller regulates the supply of power from an input node to a load coupled to an output node. The controller includes at least one limiting circuit configured to control a first switch connected between the input node and the load to limit an output current of the first switch for application to the load. A control logic circuit determines a state of the first switch and outputs a local state signal, and a communication circuit responsive to the local state signal establishes a voltage or current level corresponding to the local state at a communication circuit output. A communication terminal is also provided that is responsive to the communication output and that is adapted to connect to a second communication terminal of a second hot-swap controller to communicate the local state to the second hot-swap controller.

18 Claims, 11 Drawing Sheets

(51) Int. Cl.
*G06F 1/30* (2006.01)
*G06F 1/26* (2006.01)

(56) References Cited

U.S. PATENT DOCUMENTS

| | | | |
|---|---|---|---|
| 10,003,190 B2 | 6/2018 | Simonson et al. | |
| 2003/0023802 A1* | 1/2003 | Ho | G06F 13/4081 710/302 |
| 2010/0007217 A1* | 1/2010 | Steele | H02J 1/001 307/131 |
| 2014/0070887 A1* | 3/2014 | Lam | H03F 3/3069 330/261 |
| 2015/0016005 A1 | 1/2015 | Simonson et al. | |
| 2016/0218501 A1* | 7/2016 | Eddleman | H02H 5/04 |
| 2018/0102774 A1* | 4/2018 | Leong | H03K 17/166 |

FOREIGN PATENT DOCUMENTS

| | | |
|---|---|---|
| CN | 104283421 A | 1/2015 |
| CN | 108336722 A | 7/2018 |
| CN | 109830947 A | 5/2019 |
| CN | 112350288 A | 2/2021 |
| CN | 216872849 U | 7/2022 |
| DE | 102020120506 A1 | 2/2021 |
| TW | 201517435 A | 5/2015 |

OTHER PUBLICATIONS

"Chinese Application Serial No. 202010788169.3, Office Action dated Aug. 12, 2022", w/o English translation, 10 pgs.

* cited by examiner

COMMUNICATION TERMINAL FOR HOT-SWAP CONTROLLERS

FIELD OF THE DISCLOSURE

This document generally relates to hot swap controllers and protections switches for limiting inrush currents and fault currents in high power electrical systems and, in particular, to a communication terminal that provides communications among multiple hot-swap switch controllers to communicate information such as turn-on, mode, and overcurrent status, whereby multiple hot-swap switch controllers may operate in parallel to limit currents in high power systems where a single switch controller is not effective or would be more expensive.

BACKGROUND

A hot-swap circuit applies power from an input source to a load in a controlled and protected fashion. One function of such a controller is to limit inrush currents from the power source to the load, particularly for a load presenting a capacitance, when power is first applied or if the power source voltage suddenly increases. Another function is to limit current if the load attempts to draw too much current, for example, if there is a fault such as a short circuit at the load.

At high power levels, hot-swap controllers may implement complex staged architectures that may involve use of many transistor driver outputs (e.g., gate drive outputs) along with specialized control circuitry in a single device package. Such hot-swap controllers cannot be simply connected in parallel because they are generally unable to coordinate the turn on, turn off, and fault behavior amongst each other.

SUMMARY OF THE DISCLOSURE

This document generally relates to hot swap/inrush controllers and protections switches for limiting inrush currents and fault currents in high power electrical systems and, in particular, to a hot-swap communication terminal that provides communications among multiple hot-swap switch controllers to communicate information such as turn-on, mode, and overcurrent status. The controllers described herein may operate in parallel to limit currents in high power systems where a single switch controller is not effective or would be more expensive.

In sample embodiments, a communication terminal is added to the hot-swap controller that allows multiple controllers, operating in multiple modes, to communicate turn-on, mode, and overcurrent status so that they work as well together as a single integrated solution. Each hot-swap controller, in turn, includes control logic and a communication circuit that ties together, via the communication terminal, two or more hot-swap circuits to enable the hot-swap circuits to operate in tandem.

In sample embodiments, a hot-swap controller is provided that regulates the supply of power from an input node to a load coupled to an output node. The controller includes at least one limiting circuit configured to control a first switch connected between the input node and the load to limit an output current of the first switch for application to the load. In the sample embodiments, the controller includes a control logic circuit that determines a state of the first switch and outputs a local state signal, a communication circuit responsive to the local state signal to establish a level (e.g., voltage or current) corresponding to the local state at a communication circuit output, and a communication terminal that is responsive to the communication output and that is adapted to connect to a second communication terminal of a second hot-swap controller to communicate the local state to the second hot-swap controller.

In the sample embodiments, the control logic circuit may implement a state diagram having at least three states: a first state where all hot-swap controllers are OFF; a second state where all switches are turned ON for normal operation; and a third state where all switches have reached current limit. In the sample embodiments, the control logic may also implement the state diagram with a further state comprising a fourth state where all low-stress stage start switches are turned ON and all other switches are OFF. A first timer is also provided that is initiated when the controller enters the fourth state, and a fault signal is signaled when the first timer times out before the low-stress stage start switches successfully charge the load. Also, a second timer is provided that is initiated when the controller enters the third state, and all switches are turned OFF when the second timer times out while the controller remains in current limit in the third state. In such embodiments, the communication circuit outputs an OFF signal to the communication terminal when the controller is in the first state, a low-stress start signal to the communication terminal when the controller is in the fourth state, an ON signal to the communication terminal when the controller is in the second state, and a current limit signal to the communication terminal when the controller is in the third state. In such sample embodiments, the OFF signal has a voltage between ground and a first threshold, the low-stress start signal has a voltage between the first threshold and a second threshold greater than the first threshold, the ON signal has a voltage between the second threshold and a third threshold greater than the second threshold, and the current limit signal has a voltage greater than the third threshold. In the sample embodiments, when the second hot-swap controller is in a different local state than the hot-swap controller, the hot-swap controller and the second hot-swap controller arbitrate whereby the hot-swap controller in a lower state wins and the lower state becomes an effective global state for the hot-swap controller and the second hot-swap controller.

In sample embodiments, the controller may be in a single MOSFET configuration, a parallel configuration, a low-stress staged start configuration, and/or a high-stress staged start configuration.

In further sample embodiments, a current limit hysteresis circuit may be provided that adds an offset to an current regulated by the at least one limiting circuit when the second switch is turned OFF. The current limit hysteresis circuit may include a resistor and a current source between a current sense resistor and ground when the first switch is ON, the current limit hysteresis circuit adding a current to a current sensed by the current sense resistor when the second switch is turned OFF.

In still further embodiments, a plurality of series-connected switches and current sense resistors are provided in parallel configuration between the input node and the load. Optionally, a plurality of shunt switches may be connected in parallel with the respective switches between the current sense resistors and the load.

In additional sample embodiments, a system is provided that regulates the supply of power from an input node to a load coupled to an output node. The system includes a first hot-swap controller connected between the input node and the load. The first hot-swap controller includes a first communication circuit that outputs a conducting state of the first hot-swap controller to a first communication terminal. A second hot-swap controller connected between the input node and the load is also provided. The second hot-swap controller includes a second communication circuit that outputs a conducting state of the second hot-swap controller to a second communication terminal. The first communication terminal is connected to the second communication terminal to enable the first hot-swap controller and the second hot-swap controller to communicate their respective conducting states to each other. Controllers for different staging schemes may be coordinated through the communication terminals. For example, the first hot-swap controller may be a low-stress staged start hot-swap controller and the second hot-swap controller may be a high-stress staged start hot-swap controller or a parallel hot-swap controller having at least two switches operating in parallel to limit current between the input node and the load.

In still further sample embodiments, a hot-swap controller is provided that regulates the supply of power from an input node to a load coupled to an output node.

The controller includes an input terminal that receives a signal indicative of current between the input node and the load through a first switch, and a current limiting circuit comprising a current limit hysteresis circuit that adds an offset in a current regulated by the current limiting circuit when a second switch in parallel with the first switch is turned OFF. In sample configurations, the current limit hysteresis circuit may include a resistor and a current source between a current sense resistor and ground when the first switch is ON, the current limit hysteresis circuit adding a current to a current sensed by the current sense resistor when the second switch is turned OFF. The current limiting circuit may also provide a control output to turn ON the second switch when the first switch is not in current limit and to turn OFF the second switch when the first switch is in current limit or the second switch is outside its safe operating area.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description with respect to FIGS. 1-11 sufficiently illustrates specific embodiments to enable those skilled in the art to practice them. Other embodiments may incorporate structural, logical, process, and other changes. Portions and features of some embodiments may be included in, or substituted for, those of other embodiments. Embodiments set forth in the claims encompass all available equivalents of those claims. The example embodiments are presented for illustrative purposes only and are not intended to be restrictive or limiting on the scope of the disclosure or the claims presented herein.

A hot-swap circuit applies power from an input source to a load in a controlled and protected fashion. One function of such a controller is to limit inrush currents from the power source and the load, especially load capacitance, when power is first applied. A second function is to limit inrush current if the input power source voltage increases suddenly. A third function is to limit current if the load attempts to draw too much current, for example if there is a short circuit in the load.

Figure 1:
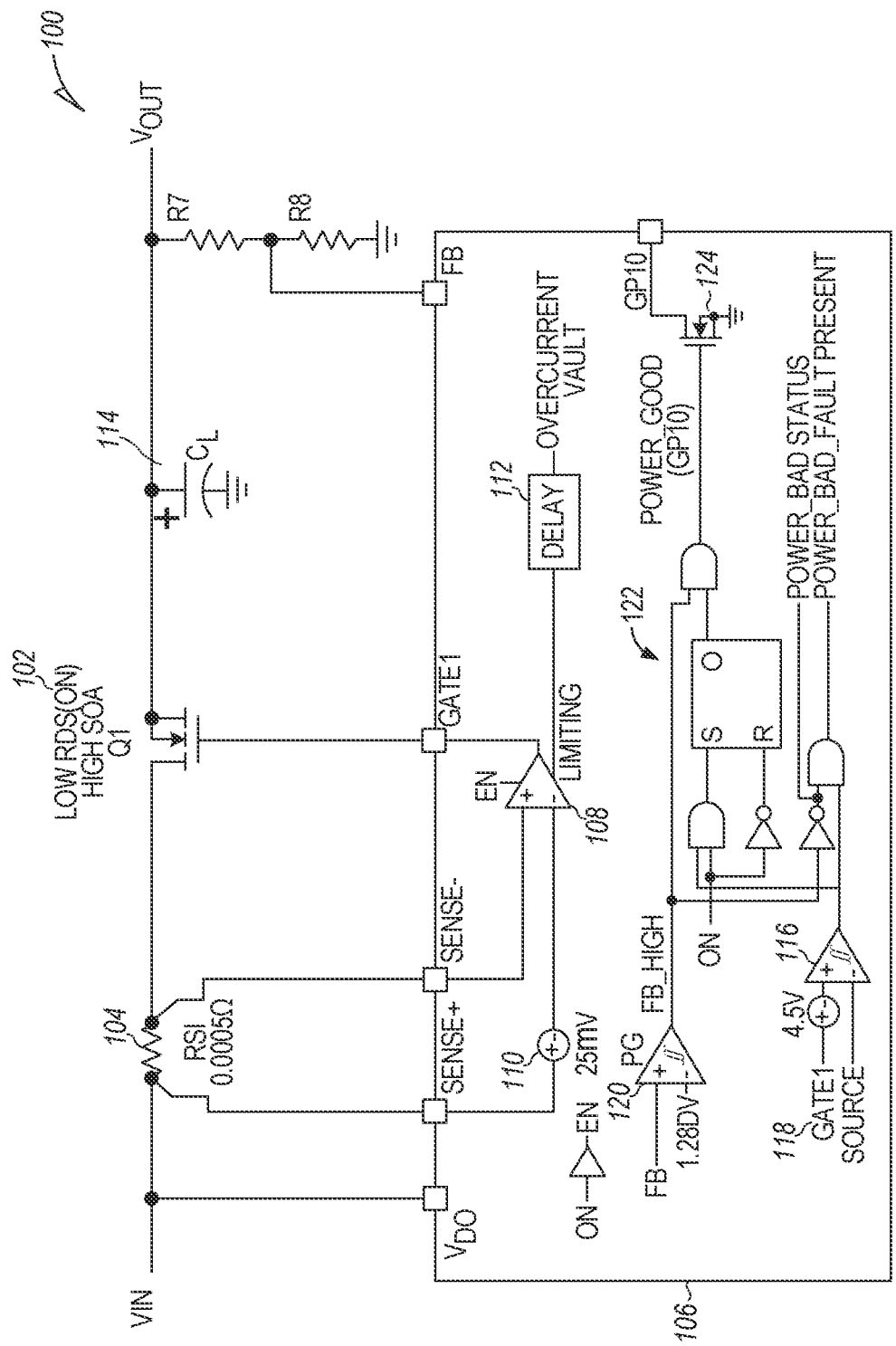
FIG. 1 illustrates a hot-swap controller with a single MOSFET.

FIG. 1 illustrates a hot-swap controller 100 with a single MOSFET (Q1) 102 in series with a current sense resistor (RS1) 104 along with control circuitry 106 for limiting current. When limiting current, the hot-swap controller 100 modulates the gate to source voltage of MOSFET 102 in order to limit the voltage across the current sense resistor 104 and thus the current through the MOSFET 102. During this time, the voltage and current through the MOSFET 102 may both be large, resulting in high power dissipation in the MOSFET 102. If this power dissipation persists, the MOSFET 102 may reach temperatures that cause damage. MOSFET manufacturers present the safe limits on MOSFET voltage, current, and time as a family of curves referred to as Safe Operating Area (SOA). In typical embodiments, MOSFET 102 is a high SOA element. Also, a timer circuit 112 in the control circuitry 106 typically sets a maximum time the MOSFET 102 will operate in current limit. When this time expires, the MOSFET 102 is turned off to protect it from overheating. The load will lose power and the hot-swap controller 100 will indicate that a fault has occurred.

During operation, the control circuitry 106 limits current using a current limit amplifier 108 that compares a voltage representing the current in the current sense resistor 104 with a voltage $V_{LIMIT}$ produced by a voltage source 110 to control the gate of the MOSFET 102 to reduce the output current when the sensed current in current sense resistor 104 exceeds a maximum value established by the voltage $V_{LIMIT}$. Also, a transistor (not shown) may be provided for turning the hot swap circuit 100 on or off. The timer circuit 112 may be coupled to a status terminal of the current limit amplifier 108 to enable detection of the time when the current limit amplifier 108 begins limiting the current. When the delay period set by the timer circuit 112 expires, the MOSFET 102 is turned off to protect it from overheating. The load will lose power and the hot swap controller 100 will indicate at the status terminal that a fault has occurred.

Often high power hot-swap applications need to charge large bypass capacitors 114 ($C_L$) across the load. To reduce stress on the MOSFET 102, the load may be kept off until the bypass capacitors 114 are charged. A small charging current for the capacitance keeps the power in the MOSFET 102 low enough to prevent a dangerous rise in temperature. One method to reduce the charging current uses a capacitor (not shown) coupled between the gate of the MOSFET 102 and ground to limit the voltage slew rate of the gate terminal (GATE1). The gate voltage may be pulled up by a current from a current source (not shown) that is provided for pulling up the gate voltage of the MOSFET 102. The MOSFET 102 acts as a source follower while charging the load capacitance. Another method uses the current limit amplifier 108 to set the current charging the load capacitance. Either method may lower the inrush current such that the startup period stays within the SOA of the MOSFET 102. When the charging is finished, the hot-swap controller 100 may provide an output indicating the power path is on to show that full current is available to the load.

The on-state of a switch may be determined by monitoring its control signal. In sample embodiments, this monitoring is performed for the MOSFET Switch 102 using a hysteresis comparator 116 that compares the gate to source voltage of the MOSFET 102 with a threshold voltage (SOURCE) produced by a voltage source 118 well above a threshold voltage of the MOSFET 102, for example, at 4.5 V. Another hysteresis comparator 120 may compare the voltage on feedback terminal (FB) placed at the junction of external resistors R7 and R8 to a threshold voltage to determine the status of FB. The outputs of hysteresis comparators 116 and 120 are provided to logic circuitry 122 to determine status signals indicating whether the power is good (POWER_GOOD) and, if so, the POWER_GOOD status signal is provided to status terminal (GPIO) via transistor 124. On the other hand, if the power is bad (POWER_BAD), or if a fault is present (POWER_BAD_FAULT), such indications are provided to the appropriate status terminal.

The hot swap MOSFET 102 itself has resistance that is a source of power loss in the electrical circuits. MOSFET switches refer to this as on-resistance. High power systems with large load currents have a significant power loss due to this on-resistance. To address the issue of on-resistance, high current hot-swap applications may use one or more MOSFETs in parallel with the MOSFET 102 to achieve a low on-resistance that is unavailable in a single MOSFET 102.

Figure 2:
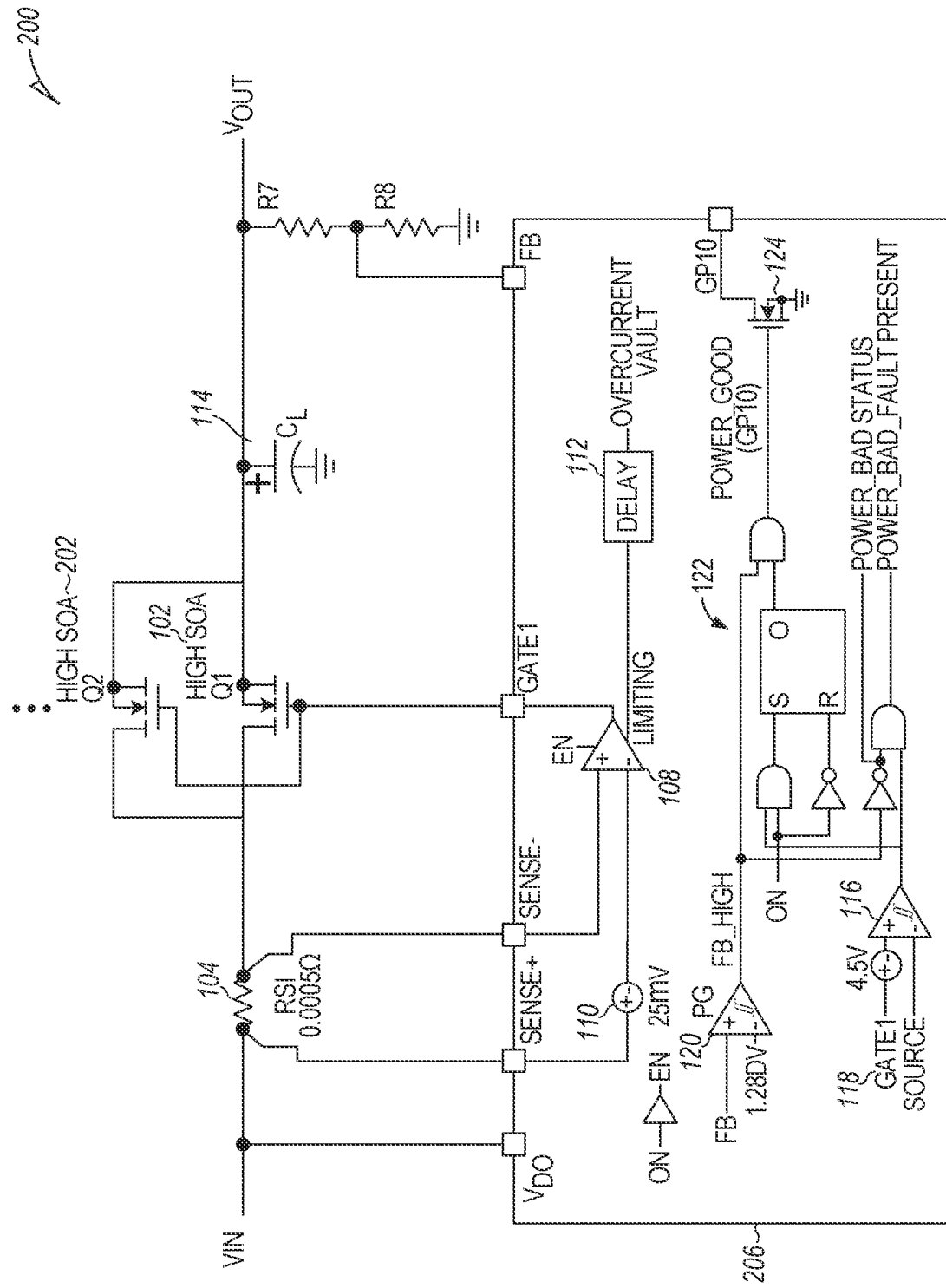
FIG. 2 illustrates a hot-swap controller with parallel MOSFETs.

FIG. 2 illustrates a hot-swap controller with parallel MOSFETs. MOSFET 202 is added in parallel to MOSFET 102, for gate, source and drain terminals. In this configuration the on resistance is halved when the MOSFET gates are fully enhanced, but during current limiting the MOSFET with the lower threshold voltage will conduct more current and dissipate more power, causing its temperature to rise. Since MOSFETs have a negative temperature coefficient with respect to threshold voltage, the MOSFET will conduct more current as it heats up in a thermal runaway fashion until nearly all the power is dissipated in one MOSFET. Because of this, MOSFETs connected in this manner may only be relied upon to have a net SOA of a single MOSFET.

Figure 3:
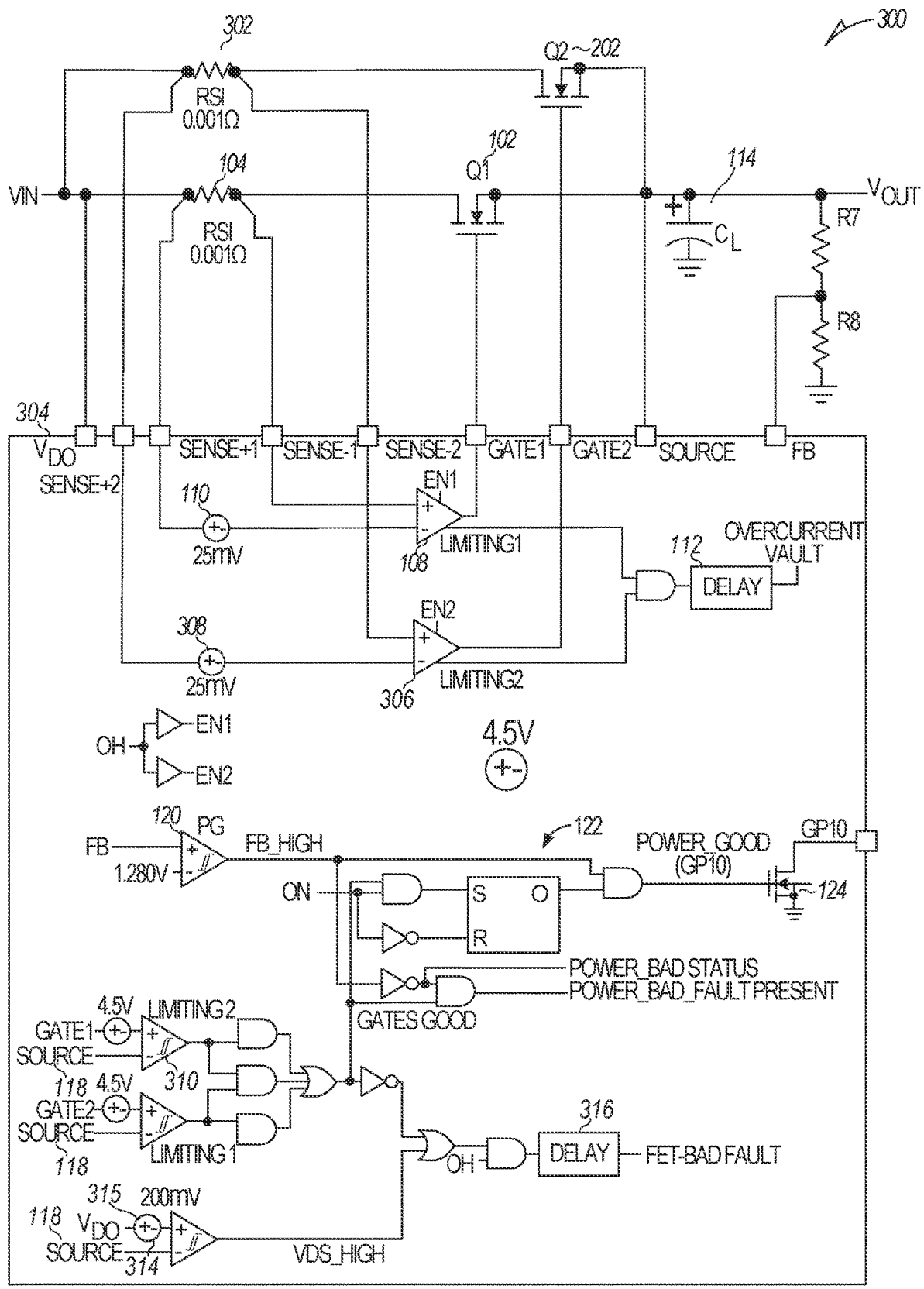
FIG. 3 illustrates a hot-swap controller having a simultaneous parallel configuration.

FIG. 3 illustrates a hot-swap controller 300 having a simultaneous parallel configuration. As illustrated, MOSFET (Q2) 202 is connected in series with a current sense resistor (RS2) 302, and MOSFET 202 and current sense resistor 302 are connected in parallel with MOSFET 102 and current sense resistor 104. During operation, the control circuitry 304 limits current through the MOSFET 102 using a current limit amplifier 108 that compares a voltage representing the current in the current sense resistor 104 with a voltage $V_{LIMIT}$ produced by a voltage source 110 to control the gate of the MOSFET 102 to reduce the output current when the sensed current in current sense resistor 104 exceeds a maximum value established by the voltage $V_{LIMIT}$. The control circuitry 304 also limits current through the MOSFET 202 using a current limit amplifier 306 that compares a voltage representing the current in the current sense resistor 302 with voltage $V_{LIMIT}$ produced by a voltage source 308 to control the gate of the MOSFET 202 to reduce the output current when the sensed current in current sense resistor 302 exceeds a maximum value established by the voltage $V_{LIMIT}$. When both MOSFETs 102 and 202 are in current limit, timer circuit 112 in the control circuitry 304 sets a maximum time the MOSFETs 102 and 202 may operate in current limit. When this time expires, the MOSFETs 102 and 202 are turned off to protect from overheating. The load will lose power and the hot-swap controller 300 will indicate that an overcurrent fault has occurred.

Like the embodiments of FIG. 1 and FIG. 2, the on-state of a switch of the hot-swap controller 300 may be determined by monitoring its control signal. In sample embodiments, this monitoring is performed for the MOSFET Switch 102 using hysteresis comparator 310 that compares the gate to source voltage of the MOSFET 102 with a threshold voltage (SOURCE) produced by a voltage source 118 well above a threshold voltage of the MOSFET 102, for example, at 4.5 V. Similarly, the on-state of MOSFET Switch 202 may be monitored using hysteresis comparator 312 that compares the gate to source voltage of the MOSFET 202 with a threshold voltage (SOURCE) produced by the voltage source 118 well above a threshold voltage of the MOSFET 202, for example, at 4.5 V. Also, hysteresis comparator 120 may compare the voltage on the feedback terminal (FB) placed at the junction of external resistors R7 and R8 to a threshold voltage (e.g., 1.28 V) to determine if FB is high. The outputs of hysteresis comparators 120, 310, and 312 are provided to logic circuitry 122 to determine status signals indicating whether the power is good (POWER_GOOD) and, if so, the POWER_GOOD status signal is provided to status terminal (GPIO) via transistor 124. On the other hand, if the power is bad (POWER_BAD), or if a fault is present (POWER_BAD_FAULT), such indications are provided to the appropriate status terminal.

However, with parallel MOSFETs, board resistance, offset and mismatch effects may cause one channel to go into current limit before the second channel. Since one channel is still fully on, keeping the voltage from the MOSFET drain to source (VDS) low, the current limiting MOSFET will not suffer significant heating and the impedance of the circuit is still low, so the load may be allowed to continue operating. The GATES-GOOD signal is produced when either both gates are high, or one gate is high and the opposite gate is in current limit. GATES-GOOD means that the full current is available to the load. Also, hysteresis comparator 314 compares $V_{DD}$ 315 to SOURCE 118 to determine if VDS is high. If one of the gate terminals is not high and not in current limit, it may not have enough gate voltage to allow full load current, so POWER_GOOD is suppressed when VDS is HIGH. In such a case, the FET-BAD fault timer 316 is run.

The multiple gate driver circuits also allow the banks of MOSFETs to be started up and operated in stages. There are two architectures for doing this with two MOSFETs. The first is called 'Low-stress staged start' and the second is called 'High-stress staged start.'

Figure 4:
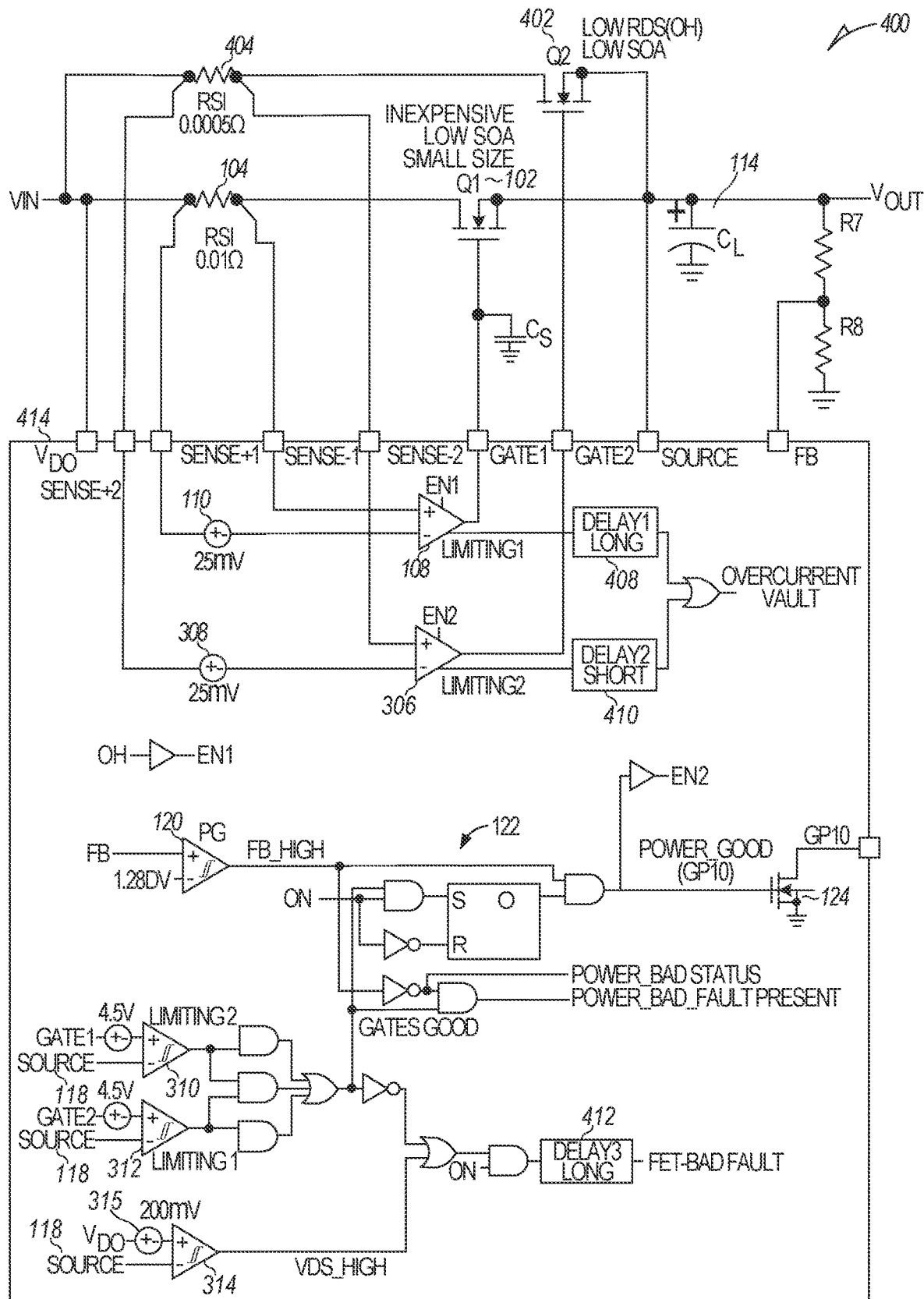
FIG. 4 illustrates a low-stress staged start configuration.

FIG. 4 illustrates a low-stress staged start configuration. Low-stress staged start (LSSS) is used in applications that traditionally have used a gate capacitor to limit inrush current to low levels. For LSSS hot-swap circuit 400, a second MOSFET 402 and current sense resistor 404 is added and the absence of a power-good signal is used to hold one side off until the other side has powered up the load with a small, inexpensive MOSFET 102 at a low current limit with a relatively large value sense resistor 104. When the load is fully charged and the startup MOSFET 102 is fully enhanced, the power-good signal is asserted and the second (shunt) side MOSFET 402 is enabled. The shunt side has a high current limit to deliver the full payload current and uses one or more low RDS-on (resistance when the device is in saturation), low SOA MOSFETs 402 in series with a current sense resistor 404. The delay time before the current limit circuit 414 produces a fault and shuts off is long for channel 1 to allow for startup, or a slew rate limiting capacitor (CS) 406 is placed on the GATE1 terminal to keep MOSFET 102 out of current limit. In this case, the current limit is low enough to run out the timer 408 before any load condition could damage the startup MOSFET 102. On the other hand, the fault delay of the timer 410 for channel 2 is selected to be short to stay within the SOA of the shunt MOSFET(s) 402. This architecture minimizes the cost of MOSFETs to achieve a given load current and RDS-on and, by selecting a long delay time for timer 412, the control circuitry 414 is tolerant to faults that would destroy a single MOSFET with a gate capacitor. However, with the short timer time for current limit at full current, control circuitry 414 has limited ability to ride through a load surge beyond current limit or input voltage steps and cannot start up a resistive load.

Figure 5:
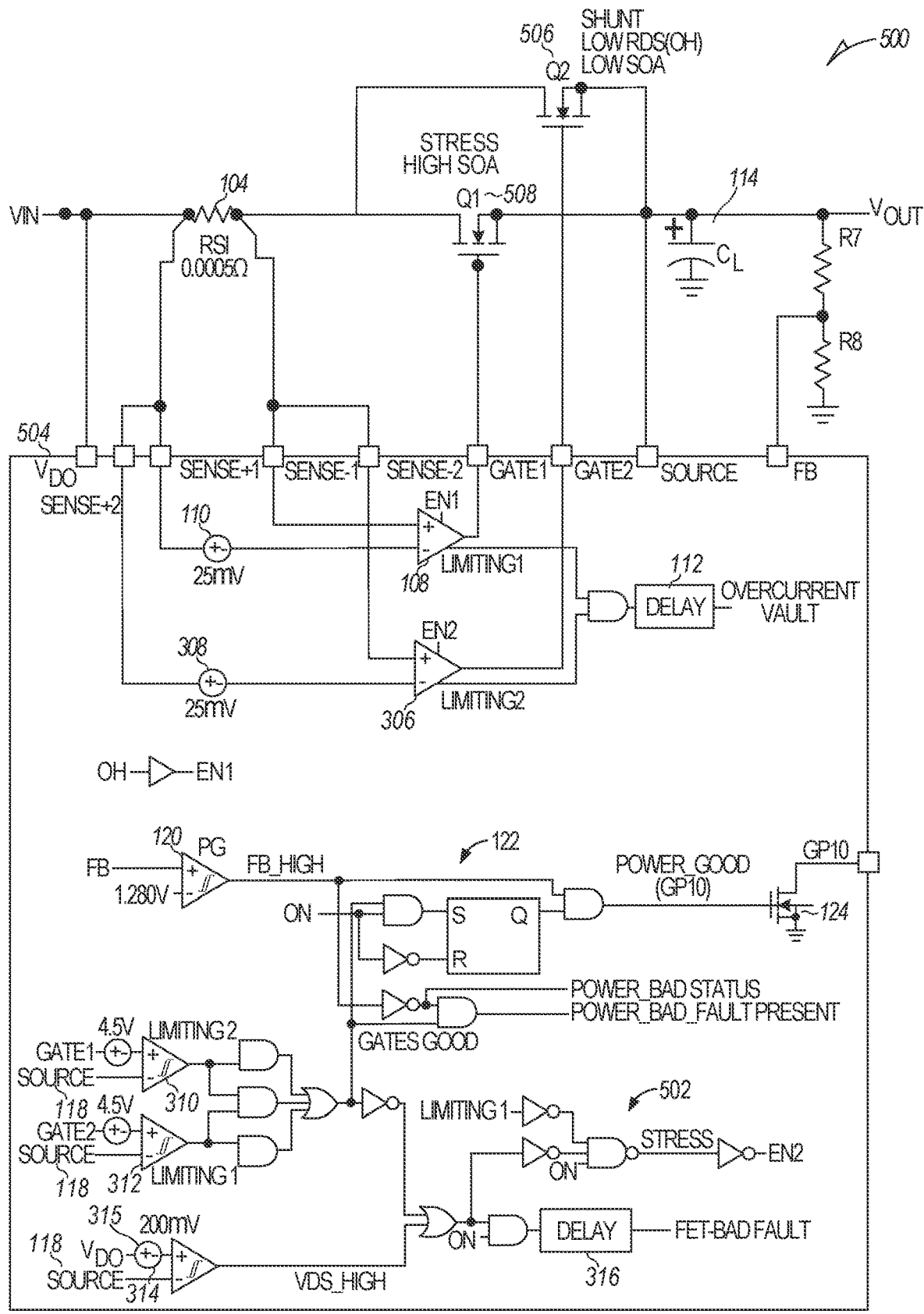
FIG. 5 illustrates a high-stress staged start configuration.

FIG. 5 illustrates a high-stress staged start configuration. Some applications have loads that are always on, or input steps and output surges that put additional stress on the hot-swap MOSFET. These applications require large SOA MOSFETs to safely ride through the startup and operating transients. With a single current limit circuit and several MOSFETs in parallel, all the MOSFETs must be large enough to withstand this stress. However, adding a second MOSFET control circuit and using a High-Stress Staged Start (HSSS) allows all but one of these MOSFETs to be replaced with common, inexpensive, low-SOA MOSFETs with low RDS-ON that are optimized for switching regulators.

For HSSS hot-swap circuit 500, the second (shunt) side is gated by a stress signal 502 from control circuitry 504 so that one or more low RDS-on, low SOA MOSFETs 506 may be used to achieve RDS-on and turned off whenever SOA stress is encountered, while a single high SOA (stress) MOSFET 508 is used for inrush and to ride through transients with a long timer time. During inrush, the VDS of the MOSFETs is high and the gate of the inrush MOSFET 508 is not fully enhanced because it is in current limit, so the STRESS signal is present, which holds the shunt MOSFET(s) 506 off. The stress MOSFET 508 starts up the load alone, either with a gate capacitor (setting the inrush current) or in current limit. When startup is complete and VDS is low, the gate to source voltage (VGS) of the stress MOSFET 508 is high (fully enhanced), and the stress MOSFET 508 is not in current limit, so the STRESS condition is removed to enable the shunt MOSFET(s) 506 to turn on. If the circuit enters current limit, VDS increases or the gate condition becomes bad and the shunt MOSFET(s) 506 are turned off by a stress signal 502 from the control circuitry 504 to protect the shunt MOSFET(s) 506 from heating. This architecture uses the stress MOSFET 508 to ride through current limiting load surges as well as input voltage steps and may also start up a resistive load. The high SOA stress MOSFET 508 is more expensive than the trickle MOSFET 102 in the LSSS scenario but may be cheaper than two or more moderate SOA MOSFETs used in the parallel configuration.

Figure 6:
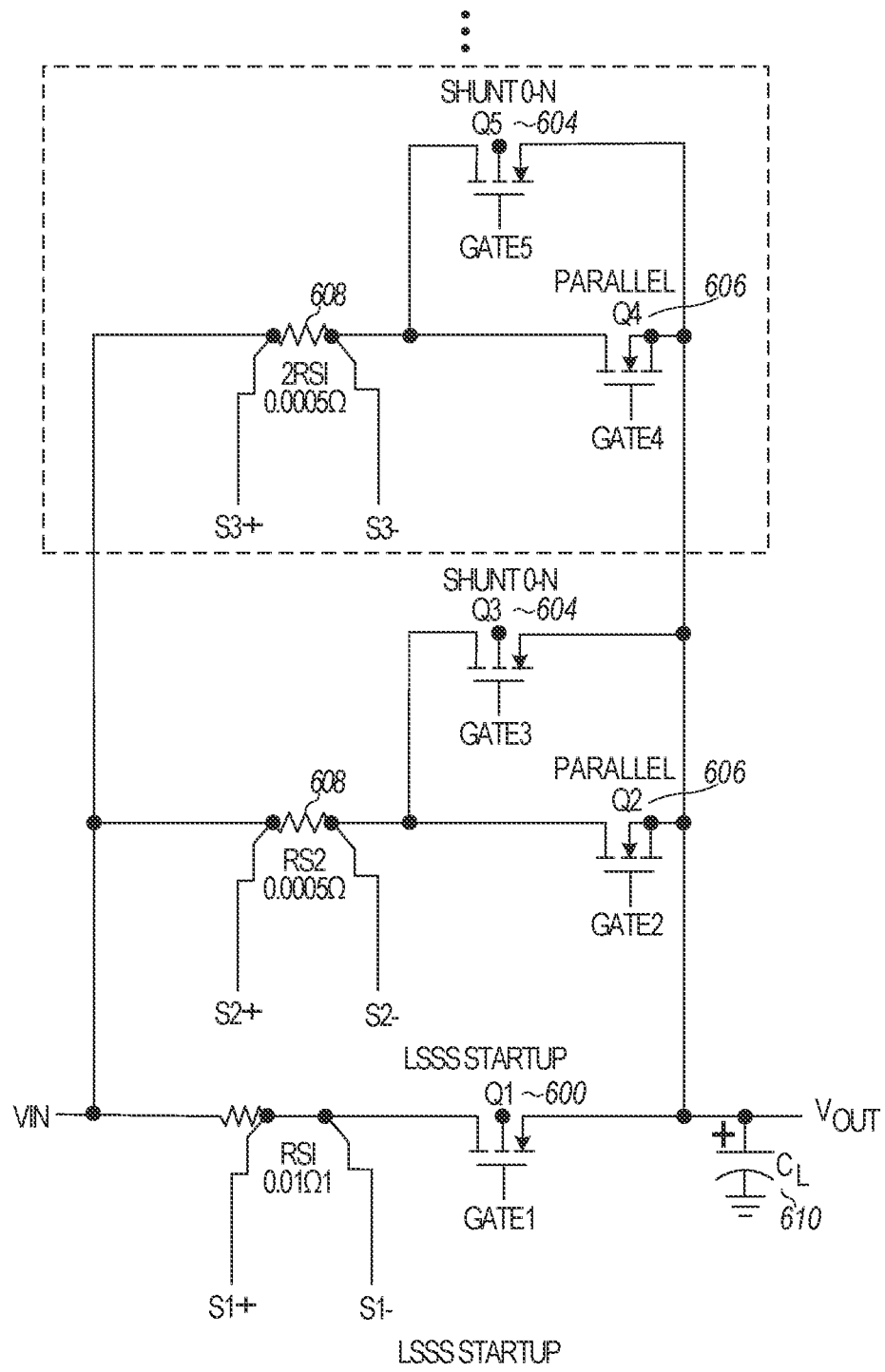
FIG. 6 illustrates a plurality of MOSFETs in parallel as desired to meet current and power requirements.

Further details regarding the circuits illustrated in FIGS. 3-5 may be found in U.S. Pat. No. 10,003,190, the contents of which are incorporated herein by reference. It will be appreciated that all three of the configurations illustrated in FIGS. 3-5 may be combined into a hot-swap circuit with maximum flexibility and unlimited current carrying capability by adding as many parallel MOSFETs as required to meet the current and power requirements. FIG. 6 illustrates such an approach where a plurality of MOSFETs are placed in parallel with LSSS MOSFET 600 and current sense resistor 602 as desired to meet current and power requirements. Zero to several MOSFETs 604 in parallel may be used for the shunt devices Q3 and Q5, while the parallel MOSFETs 606 and current sense resistors 608 and startup devices are usually a single MOSFET. The only MOSFETs in this scenario that see high SOA stress are the parallel devices 606 (e.g., Q2 and Q4). Also, bypass capacitors 610 (CO may be placed across the load.

Hot-Swap Communication Terminal

From the descriptions of the hot-swap controllers illustrated in FIG. 1-FIG. 6, it becomes apparent that a group of hot-swap controllers in parallel need to coordinate at least 2, and in some circumstances 3, pieces of information. First, they need to know if they should be off or on. Second, they need to know if all the controllers are current limiting, indicating that the entire bank is in current limit. Third, in cases where LSSS is used, the controllers need to know if they should be charging the output with their trickle channel, if one is present.

In sample embodiments, a communication (COMM) circuit and a communication terminal are added to the hot-swap controllers to enable communications capability to hot-swap controllers of the types illustrated by way of example in FIG. 1 through FIG. 6 above. A communication terminal enables the COMM signals of two or more controllers to be tied together to allow them to operate in tandem.

Figure 7:
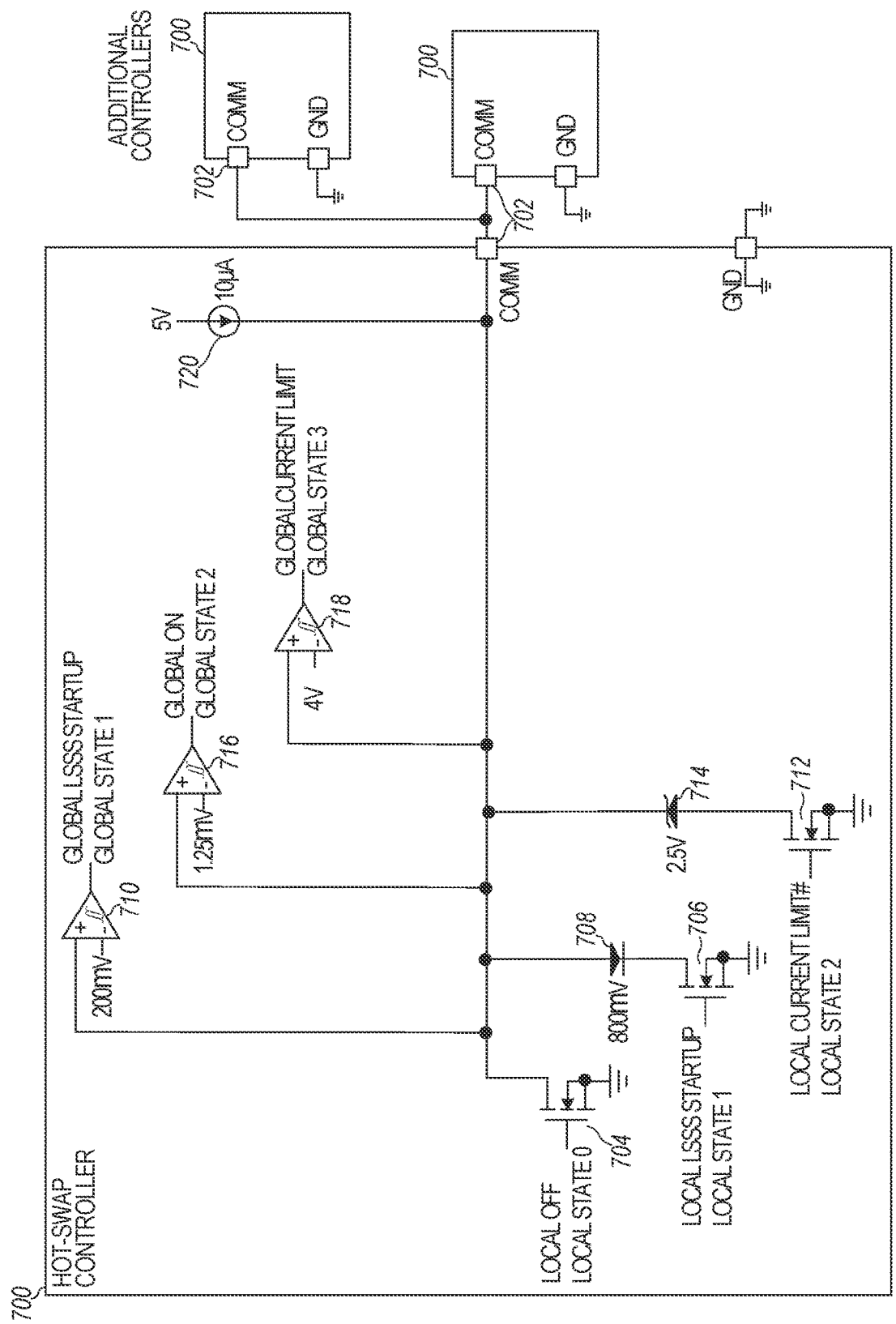
FIG. 7 illustrates communication signal circuitry for enabling multiple hot-swap controllers to communicate in sample embodiments.

FIG. 7 illustrates communication signal circuitry for enabling multiple hot-swap controllers to communicate in sample embodiments. Hot-swap controller communication circuitry 700 enables hot-swap controllers to communicate with each other via a communication terminal 702. In sample embodiments, the COMM signal provided at the communication terminal 702 has 3 or 4 local states. Local state 0 is a local off state where none of the hot-swap controllers are to turn on. MOSFET 704 holds local state 0 at ground. Optional local state 1 is the local LSSS startup state where only the trickle channel of LSSS configured hot-swap controllers may turn on. LSSS configured hot-swap controllers will regulate the COMM signal at state 1 until the LSSS MOSFETs are fully enhanced. MOSFET 706 turns ON to enable local state 1 when the voltage is above a designated level (e.g., 800 mV) as set by diode 708. When the local state 1 signal exceeds a predetermined level (e.g., 200 mV), a global LSSS startup signal for Global State 1 is output by hysteresis comparator 710. Local state 2 is the local current limit state where all the hot-swap controllers are to turn on, and hot-swap controllers that have no faults present and are not in LSSS startup regulate at local state 2. MOSFET 712 turns ON to enable local state 2 when the voltage is above a designated level (e.g., 2.5V) as set by Zener diode 714. When the local state 2 signal exceeds a predetermined level (e.g., 1.25 V), a global ON signal for Global State 2 is output by hysteresis comparator 716. Local state 3 is entered when all of the hot-swap controllers are in current limit. All hot-swap controllers that are on and in current limit will regulate to state 3. When the local state 3 is entered, global current limit signal for Global State 3 is output by hysteresis comparator 718 when the voltage exceeds a designated level (e.g., 4V).

In the illustrated configuration using a single communication terminal 702, arbitration of the progression through these states requires unanimous agreement among the hot-swap controllers. Arbitration between two controllers with different local states results in the one with the lower state winning, such that the lower state is the effective global state. Any hot-swap controller may turn off due to a fault or command and force state 0, When all hot-swap controllers are ready to turn on, they will attempt to regulate to state 1 or state 2, and the LSSS configured hot-swap controllers will win and get to state 1. When all LSSS hot-swap controllers have successfully started up, they switch to regulating state 2. State 2 is the normal operation state. As hot-swap controllers enter current limit, they will attempt to regulate to state 3, but any controllers not in current limit will keep the COMM signal at state 2. When all the hot-swap controllers are in current limit, the COMM signal will be regulated at state 3, and an overcurrent timer may run whereby any overcurrent signals or indicators may become active.

In the example hot-swap controller communication circuitry 700 of FIG. 7, using a 5V supply and voltages for the states, state 0 is ground, state 1 is 800 mV, state 2 is 2.5V, and state 3 is 5V. Each communication circuit 700 generates a 10 uA pull-up current using current source 720 to 5V on the COMM terminal 702 and uses switches and clamps to regulate at the various states. Voltage comparators 710, 716, and 718 have respective thresholds between the regulated state voltages that determine what state the hot-swap controller 700 is in. In the illustrated example, all of the hot-swap controllers are off if the COMM signal is below 200 mV. LSSS startup is active between 200 mV and 1.25V. All controllers are on and not all in current limit when the COMM signal is between 1.25V and 4V, and all the controllers are on and in current limit when the COMM signal is above 4V.

Figure 8:
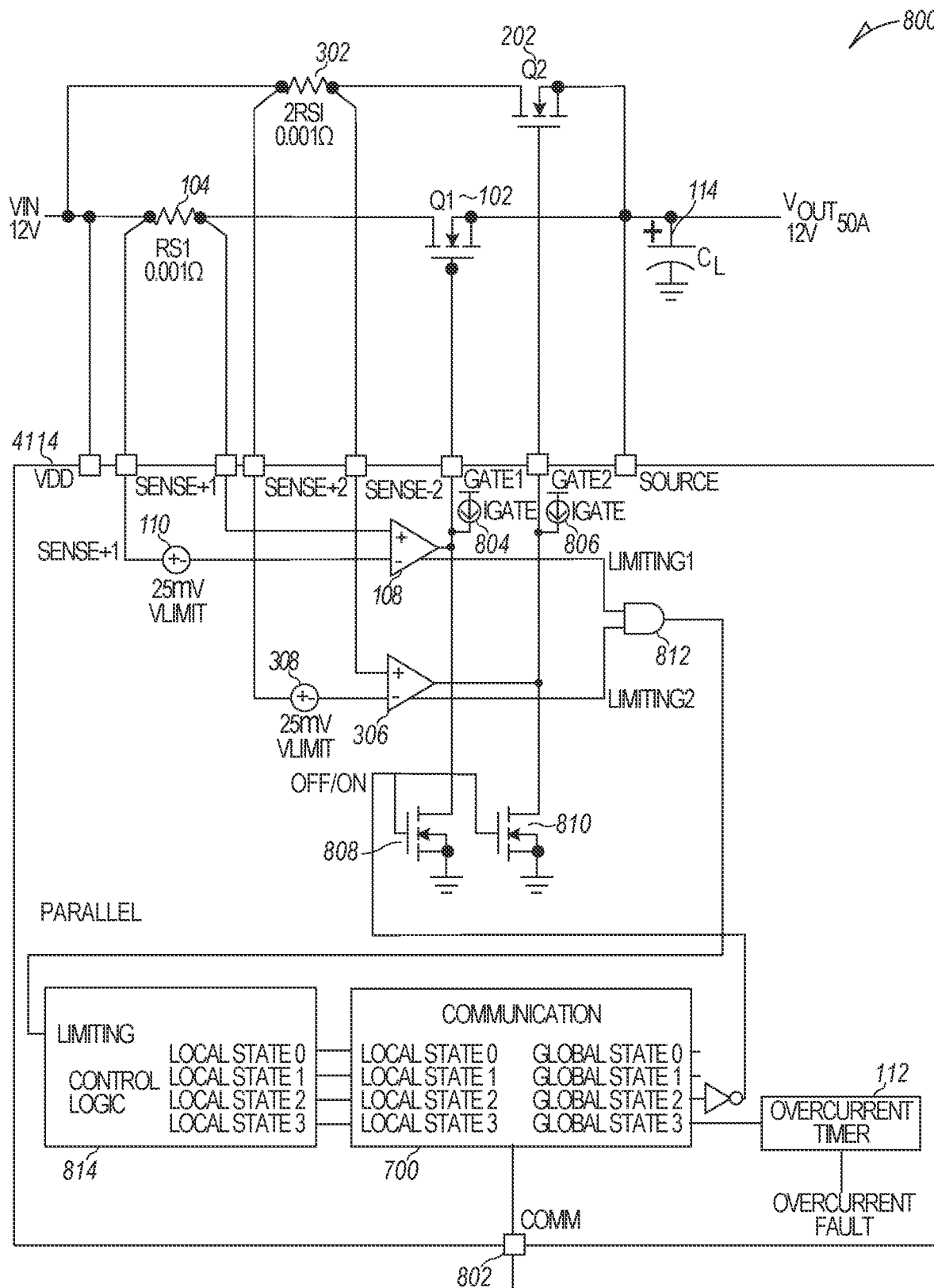
FIG. 8 illustrates a parallel configured hot-swap controller with a communication terminal connected to the communication signal circuitry in sample embodiments.

FIG. 8 illustrates a parallel configured hot-swap controller 800 with a communication terminal 802 connected to the communication signal circuitry 700 in sample embodiments. The hot-swap controller in FIG. 8 is configured like the hot-swap controller 300 of FIG. 3 except that current sources 804 and 806 provide current to pull up the gate voltage of the MOSFETs 102 and 202, respectively. Also, transistors 808 and 810 are provided for turning on and off the respective MOSFETs 102 and 202. Also, instead of applying the output of AND gate 812 directly to timer 112, the output of AND gate 812 is provided to control logic 814 that provides means for generating the local state signals 0-3 for application to hot-swap controller communication circuitry 700 of the type described above with respect to FIG. 7 for generating the Global State 0-3 signals for application to the COMM terminal 802 and for use in turning on the hot-swap controller 800 when in Global State 2 or starting the overcurrent timer 112 when in Global State 3.

Figure 9:
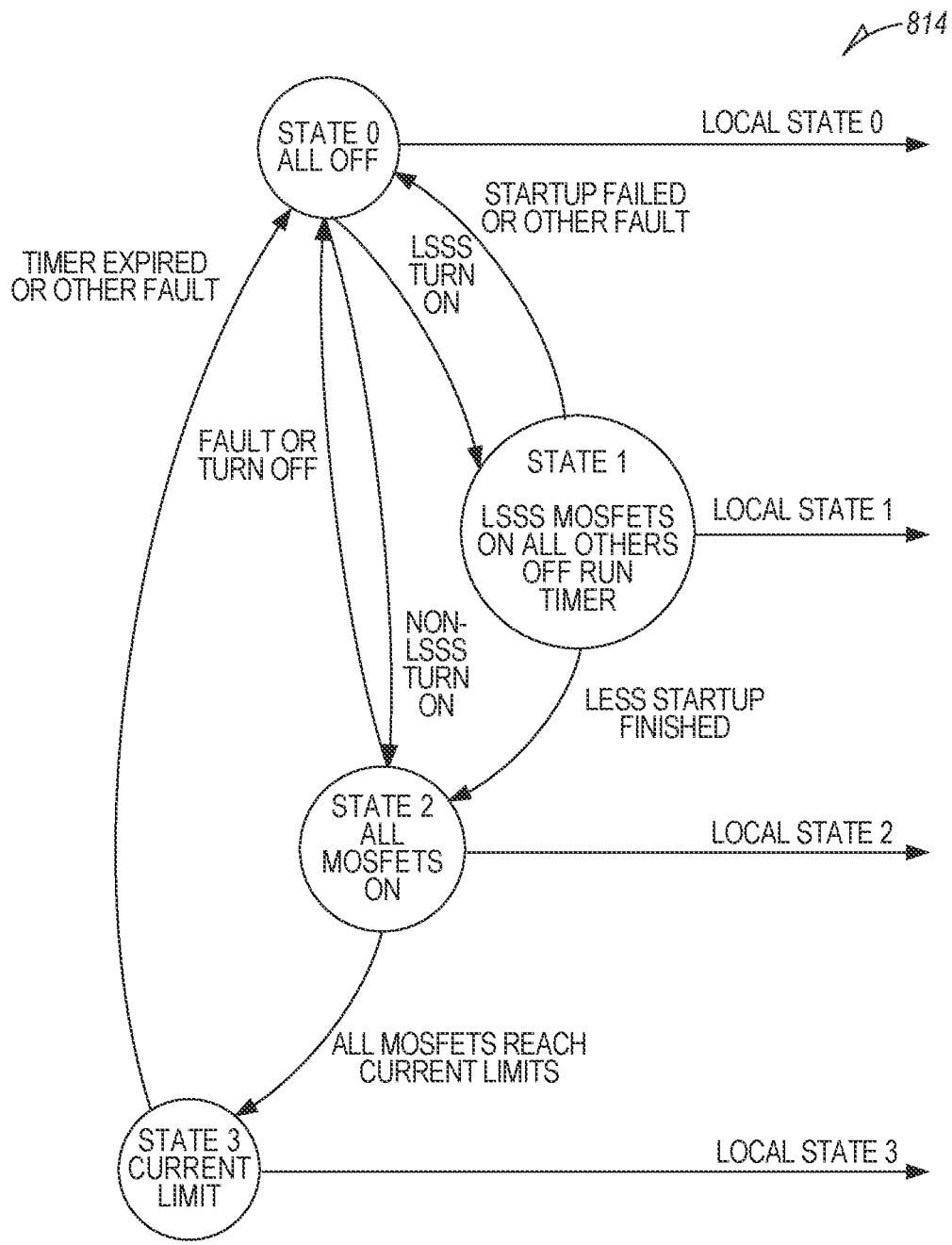
FIG. 9 illustrates a state diagram of the control logic that generates the local state information to the communication signal circuitry.

FIG. 9 illustrates a state diagram of the control logic 814 that generates the local state information for the hot-swap controller communication circuitry 700. As illustrated, local state 0 is provided by the control logic 814 when the local hot-swap controller is OFF. When the LSSS MOSFETs turn ON and all other MOSFETs are OFF, the LSSS timer is started and local state 1 is entered by the control logic 814. If the LSSS startup fails or a fault is identified, the control logic 814 returns to local state 0. On the other hand, if the LSSS startup is successful, the control logic 814 enters local state 2 and all non-LSSS MOSFETs are also turned ON. If a fault is encountered or if the hot-swap controller is turned OFF, the control logic 814 returns to local state 0. During normal operation, the control logic 814 remains in local state 2 until all MOSFETs reach current limit, at which time the control logic 814 enters local state 3 and the timer 112 is turned on. If the timer 112 expires while the MOSFETs are all in current limit or if a fault is encountered, the control logic 814 returns to local state 0. As illustrated, the local state signals are provided to the hot-swap controller communication circuitry 700 for managing the communications with other hot-swap controllers as described above. It will be appreciated that the states also may be encoded using currents instead of voltages.

Figure 10:
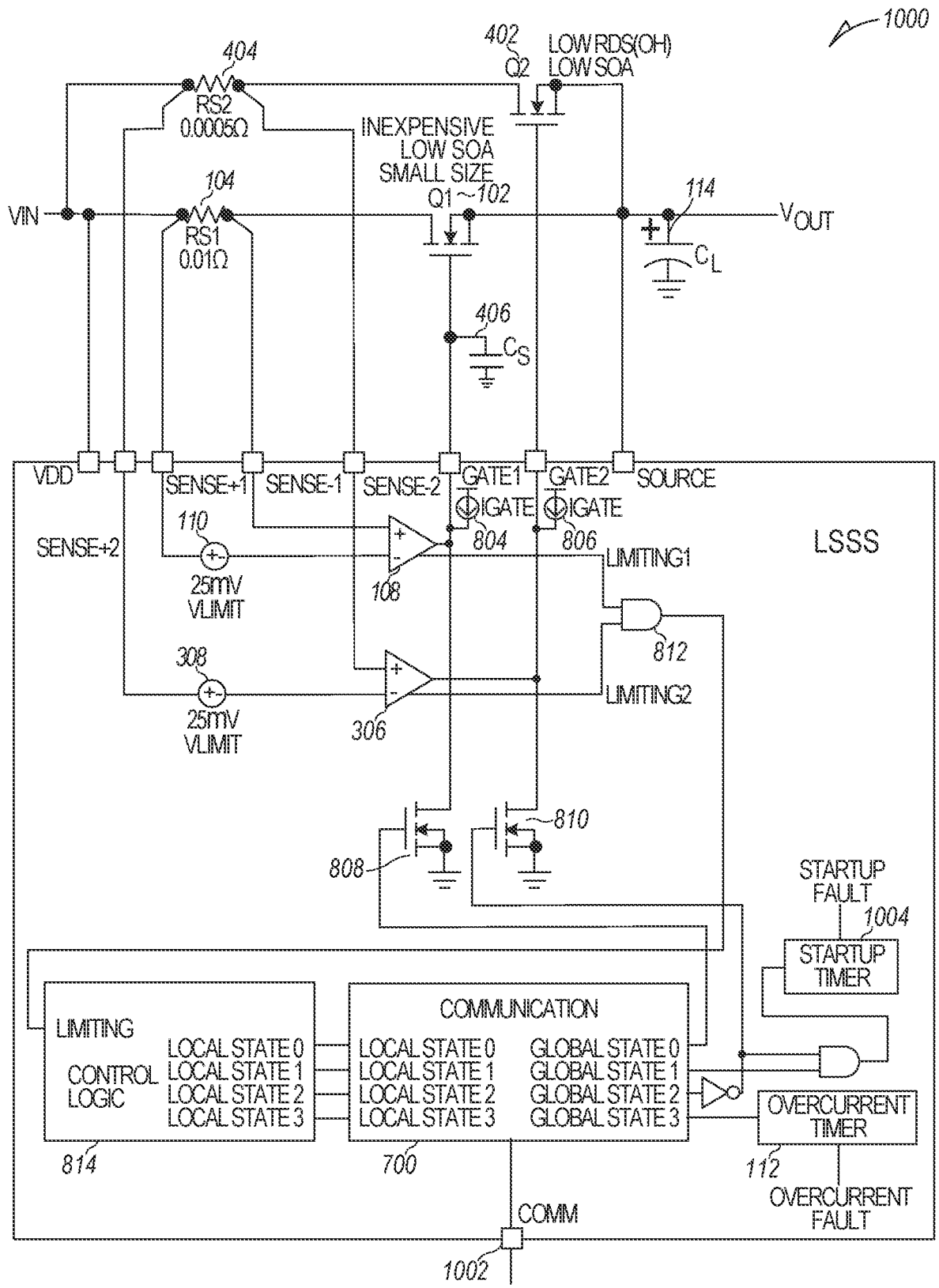
FIG. 10 illustrates a low-stress staged start configured hot-swap controller with a communication terminal connected to the communication signal circuitry in sample embodiments.

FIG. 10 illustrates a low-stress staged start configured hot-swap controller 1000 with a communication terminal 1002 connected to the communication signal circuitry 700 in sample embodiments. The hot-swap controller 1000 in FIG. 10 is configured like the hot-swap controller 400 of FIG. 4 except that current sources 804 and 806 provide current to pull up the gate voltage of the MOSFETs 102 and 202, respectively. Also, transistors 808 and 810 are provided for turning on and off the respective MOSFETs 102 and 202. Also, in this embodiment, the Global LSSS Startup signal in Global State 1 is applied to an LSSS startup timer 1004 to time the LSSS startup.

Figure 11:
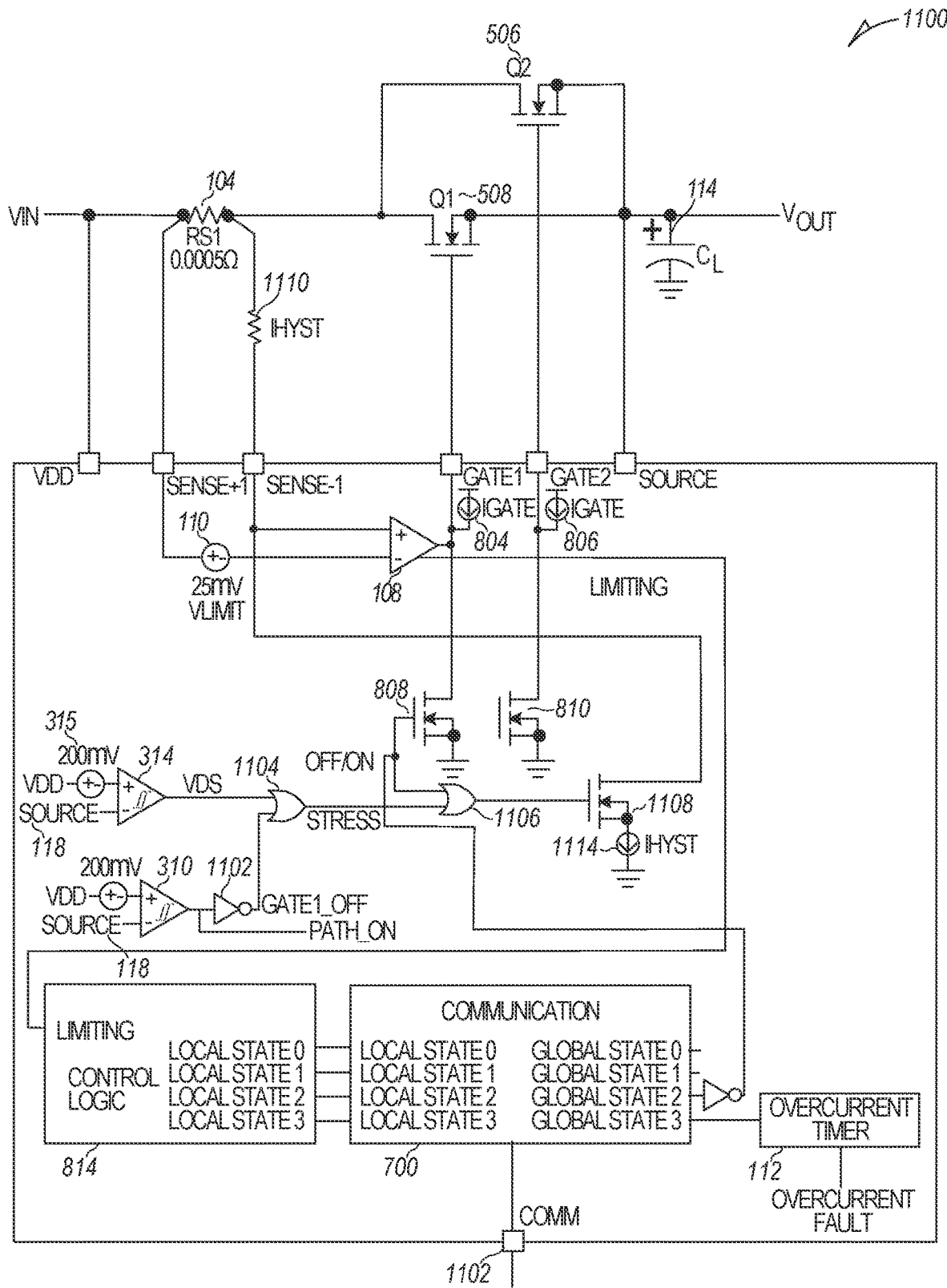
FIG. 11 illustrates a high-stress staged start configured hot-swap controller with a communication terminal connected to the communication signal circuitry in sample embodiments.

FIG. 11 illustrates a high-stress staged start configured hot-swap controller with a communication terminal 1102 connected to the communication signal circuitry 700 in sample embodiments. The hot-swap controller 1100 in FIG. 11 is configured like the hot-swap controller 500 of FIG. 5 except that current sources 804 and 806 provide current to pull up the gate voltage of the MOSFETs 102 and 202, respectively. Also, transistors 808 and 810 are provided for turning on and off the respective MOSFETs 102 and 202.

The hot-swap controller in FIG. 11 also includes a hysteresis comparator 310 monitoring the gate to source voltage of the MOSFET 508 with respect to a threshold voltage produced by a voltage source 118. The output of the comparator 310 produces the PATH_ON signal, which is coupled to an inverter 1102 that supplies a GATE1_OFF signal to an input of an OR gate 1104. The output of the OR gate 1104 produces a STRESS signal supplied to an input of an OR gate 1106 that controls the gate of the transistor 1108. The other input of the OR gate 1106 is provided with an OFF/ON signal that turns on and off the MOSFET 508. Also, a hysteresis comparator 314 monitors the drain to source voltage 315 of the MOSFETs 506 and 508 with respect to a threshold voltage produced by a voltage source 118 and supplies an output IDS signal to an input of the OR gate 1104 that produces the STRESS signal. The source of the transistor 1108 is coupled to a current source 1114 ($I_{hyst}$).

The MOSFET 508 operates as a stress MOSFET to charge the load capacitance 114 and to bring up the load voltage. MOSFET 508 provides the load current during transients with limited durations such as startup and changes in input voltage. The MOSFET 508 has higher power dissipation than the MOSFET 506. The MOSFET 508 operates with both large current and large VDS and has a high SOA rating. However, the MOSFET 508 does not require low on-resistance because it supports the load current only during limited duration transients. It may also require a long delay time provided by the timer 112.

The MOSFET 506 operates as a shunt MOSFET to provide a low resistance path for the load current around the MOSFET 508 when conditions are stable and not changing. The MOSFET 506 is turned off by the signal STRESS to protect it whenever the VDS exceeds the threshold voltage provided by the voltage source 315 or if the gate to source voltage of the MOSFET 508 is below the threshold voltage provided by the voltage source 118, for example, when the MOSFET 508 operates in a current limit mode. The threshold voltage defined by the voltage source 315 may be set, for example, at 200 mV, and the threshold voltage of the voltage source 118 may be set, for example, at 4.5 V.

The MOSFET 506 is only turned on when the STRESS signal is low, indicating that the MOSFET 508 is fully turned on and the VDS is below the threshold voltage defined by the voltage source 315. Therefore, the MOSFET 506 may have very low on-resistance. Because the MOSFET 506 is turned on with low VDS, it does not need a large SOA. The MOSFET 506 never operates in saturation, so several parallel MOSFETs may be used instead of the MOSFET 506 to achieve low on-resistance. Also, the PATH_ON signal produced by the comparator 310 is derived from the on-state of the stress MOSFET 508. Whenever the MOSFET 508 is on, the load is allowed to draw power.

In a HSSS configuration with two or more controllers of the type illustrated in FIG. 11, there is a potential for instability and oscillations of the gate voltages of the MOSFETs 506 and 508. This situation may occur because two parallel HSSS channels are not perfectly matched in practice and one will start current limiting before the other. When this happens, the bypass MOSFET 506 will turn off, which increases the RDS(ON) of that channel, diverting current to the other HSSS channel. This diverted current will reduce the current through the current sense resistor 104 and may result in the stress MOSFET 508 leaving current limit, which turns the bypass MOSFETs 506 on again, which decreases the RDS(ON) of the channel and increases the current to the current limit, at which point the cycle repeats and continues to oscillate. The diverted current will go to other channels and may cause them to current limit and start oscillating as well. This behavior is undesirable because of noise and power dissipation reasons.

To prevent such behavior, the current limit is reduced when the bypass MOSFET 506 is turned off. This is called current limit hysteresis. If the current limit is reduced by a greater percentage than the percentage of the current that is diverted by the bypass MOSFETs 506 turning off, the circuit will remain in current limit without oscillating until leaving current limit. Similarly, adjacent channels cannot be provoked into oscillating by bypass MOSFETs 506 turning off. There are a couple ways to implement this hysteresis. First, the offset of the amplifier may be adjusted by switching in currents or devices. This manner would be hard to detect from outside but is not flexible because the offset is fixed. A second method is to switch a current into one of the sense terminals when the bypass MOSFET 506 turns off, with a resistor 1110 ($R_{hyst}$) between the control circuitry 1112 and the current sense resistor 104. Adjusting the size of the resistor 1110 ($R_{hyst}$) allows the amount of hysteresis to be adjusted to be stable for the worst case of a given application.

Though the need for current limit hysteresis is most pronounced in the case of two or more HSSS channels working together, it may also oscillate on a single HSSS channel in certain circumstances. If the hot-swap is driving a resistive load and enters current limit, the bypass MOSFET 506 will turn off. This increases the RDS(ON) of the switches and causes the output voltage to drop by a small amount, which reduces the load current because the load is resistive. This reduction in current may cause the control circuitry 1112 to leave current limit and turn the bypass MOSFET 506 on again, which raises the output and puts it back in current limit. The amount of hysteresis needed to prevent this situation is very small.

Thus, as described above, hot-swap controllers configured for different staging schemes may be coordinated through the COMM terminals. For instance, an LSSS controller and a parallel controller may share the COMM terminal to yield one startup channel and 3 parallel channels. One controller may be configurable to any of the staging methods, but different types of controllers may also work in tandem using the COMM terminal.

In the sample embodiments described herein, only one COMM terminal is needed per controller to implement the COMM signal circuitry as the hot-swap controller work together using consensus to communicate turn-on, mode and overcurrent status to multiple hot-swap controllers so that they work together. No external components are necessary. However, it will be appreciated that multiple COMM terminals and control logic (e.g., AND gates with more inputs) may be used to communicate the status amongst the hot-swap controllers and to turn the hot-swap controllers off/on sequentially, as appropriate. Also, it will be appreciated that while the description herein the directed to MOSFETs, those skilled in the art will appreciate that other types of switches such as poly silicon FETs, relays and IGBT switches may be used as well.

The above detailed description includes references to the accompanying drawings, which form a part of the detailed description. The drawings show, by way of illustration, specific embodiments in which the invention may be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein may be machine or computer-implemented at least in part.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A hot-swap controller that regulates a supply of power from an input node to a load coupled to an output node, comprising:
    at least one limiting circuit configured to control a first switch connected between the input node and the load to limit an output current of the first switch for application to the load;
    a control logic circuit that determines a state of the first switch and outputs a local state signal representing a local state;
    a communication circuit responsive to the local state signal to establish a level corresponding to the local state at a communication circuit output;
    a communication terminal that is responsive to the communication circuit output and that is adapted to connect to a second communication terminal of a second hot-swap controller to communicate the local state to the second hot-swap controller, wherein the second hot-swap controller includes at least one limiting circuit configured to control a second switch connected between the input node and the load to limit an output current of the second switch for application to the load, wherein the hot-swap controller is a first hot-swap controller, and wherein the control logic circuit implements a state diagram having at least three states: a first state where the first and second hot-swap controllers are OFF; a second state where the first switch and the second switch are turned ON for normal operation; and a third state where the first and second switches have reached current limit; and
    a first timer that is initiated when the first hot-swap controller enters the third state, wherein the first and second switches are turned OFF when the first timer times out while the first hot-swap controller remains in current limit in the third state,
    wherein the control logic circuit of the first hot-swap controller includes at least one low-stress stage start switch, wherein the second hot-swap controller includes a control logic circuit including at least one low-stress stage start switch, wherein the control logic circuit of the first hot-swap controller implements the state diagram with a further state comprising a fourth state where all low-stress stage start switches are turned ON and all other switches are OFF, further comprising a second timer that is initiated when the first hot-swap controller enters the fourth state, wherein a fault signal is signaled when the first timer times out before the low-stress stage start switches successfully charge the load.

2. The controller of claim 1, wherein the communication circuit outputs an OFF signal to the communication terminal when the controller is in the first state, a low-stress start signal to the communication terminal when the controller is in the fourth state, an ON signal to the communication terminal when the controller is in the second state, and a current limit signal to the communication terminal when the controller is in the third state.

3. The controller of claim 2, wherein the OFF signal has a voltage between ground and a first threshold, the low-stress start signal has a voltage between the first threshold and a second threshold greater than the first threshold, the ON signal has a voltage between the second threshold and a third threshold greater than the second threshold, and the current limit signal has a voltage greater than the third threshold.

4. The controller of claim 3, wherein when the second hot-swap controller is in a different local state than the first hot-swap controller, the first hot-swap controller and the second hot-swap controller arbitrate whereby the first hot-swap controller in a lower state wins and the lower state becomes an effective global state for the first hot-swap controller and the second hot-swap controller.

5. The controller of claim 1, wherein the first switch is connected in series with a first current sense resistor between the input node and the load and a second switch is connected in series with a second current sense resistor between the input node and the load and configured in parallel with the series-connected first switch and first current sense circuit between the input node and the load, wherein the first limiting circuit limits current through the first switch using a first current limit amplifier that compares a voltage representing current in the first current sense resistor with a limit voltage produced by a voltage source to control the first switch to reduce a first output current when the sensed current in first current sense resistor exceeds a maximum value established by the limit voltage, and a second limiting circuit limits current through the second switch using a second current limit amplifier that compares a voltage representing current in the second current sense resistor with the limit voltage produced by the voltage source to control the second switch to reduce a second output current when the sensed current in second current sense resistor exceeds the maximum value established by the limit voltage.

6. The controller of claim 5, further comprising a timer circuit that is initiated when both the first switch and the second switch are in current limit, wherein the timer circuit sets a maximum time that the first switch and the second switch may operate in current limit, and a startup timer circuit that times a startup of the first switch and issues a startup fault signal when the startup timer circuit times out before the load is fully charged.

7. The controller of claim 1, wherein the first switch is connected in series with a first current sense resistor between the input node and the load and the second switch is connected in parallel with the first switch between the first current sense resistor and the load, wherein a second limiting circuit turns ON the second switch when the first switch is not in current limit and turns OFF the second switch when the first switch is in current limit and the second switch is outside its safe operating area.

8. The controller of claim 1, further comprising a current limit hysteresis circuit, the current limit hysteresis circuit adding an offset to a current regulated by the at least one limiting circuit when the second switch is turned OFF.

9. The controller of claim 8, wherein the current limit hysteresis circuit comprises a resistor and a current source between a current sense resistor and ground when the first switch is ON, the current limit hysteresis circuit adding a current to a current sensed by the current sense resistor when the second switch is turned OFF.

10. The controller of claim 1, further comprising a plurality of series-connected switches and current sense resistors in parallel configuration between the input node and the load.

11. The controller of claim 10, further comprising a plurality of shunt switches connected in parallel with the respective switches between the current sense resistors and the load.

12. The controller of claim 1, wherein the communication circuit establishes a voltage or current level corresponding to the local state at the communication circuit output.

13. A system that regulates a supply of power from an input node to a load coupled to an output node, comprising:
  a first hot-swap controller connected between the input node and the load, the first hot-swap controller comprising a first communication circuit that outputs a conducting state of the first hot-swap controller to a first communication terminal;
  a second hot-swap controller connected between the input node and the load, the second hot-swap controller comprising a second communication circuit that outputs a conducting state of the second hot-swap controller to a second communication terminal, wherein the first communication terminal is connected to the second communication terminal to enable the first hot-swap controller and the second hot-swap controller to communicate their respective conducting states to each other, wherein the second hot-swap controller includes at least one limiting circuit configured to control a second switch connected between the input node and the load to limit an output current of the second switch for application to the load;
  a control logic circuit that determines a state of a first switch and outputs a local state signal, wherein the control logic circuit implements a state diagram having at least three states: a first state where the first and second hot-swap controllers are OFF; a second state where the first switch and a second switch are turned ON for normal operation; and a third state where the first and second switches have reached current limit; and
  a first timer that is initiated when the first hot-swap controller enters the third state, wherein the first and second switches are turned OFF when the first timer times out while the first hot-swap controller remains in current limit in the third state,
  wherein the control logic circuit of the first hot-swap controller includes at least one low-stress stage start switch, wherein the second hot-swap controller includes a control logic circuit including at least one low-stress stage start switch, wherein the control logic circuit of the first hot-swap controller implements the state diagram with a further state comprising a fourth state where all low-stress stage start switches are turned ON and all other switches are OFF, further comprising a second timer that is initiated when the first hot-swap controller enters the fourth state, wherein a fault signal is signaled when the first timer times out before the low-stress stage start switches successfully charge the load.

14. The system of claim 13, wherein the first hot-swap controller comprises a low-stress staged start hot-swap controller and the second hot-swap controller comprises a high-stress staged start hot-swap controller.

15. The system of claim 13, wherein the first hot-swap controller comprises a low-stress staged start hot-swap controller and the second hot-swap controller comprises a parallel hot-swap controller having at least two switches operating in parallel to limit current between the input node and the load.

16. A hot-swap controller that regulates a supply of power from an input node to a load coupled to an output node, comprising:
  an input terminal that receives a signal indicative of current between the input node and the load through a first switch;
  a current limiting circuit comprising a current limit hysteresis circuit, the current limit hysteresis circuit adding an offset in a current regulated by the current limiting circuit when a second switch in parallel with the first switch is turned OFF;
  a communication terminal that is responsive to a communication circuit output and that is adapted to connect to a second communication terminal of a second hot-swap controller to communicate a local state to the second hot-swap controller;
  a control logic circuit that determines a state of a first switch and outputs a local state signal, wherein the hot-swap controller is a first hot-swap controller, wherein the control logic circuit implements a state diagram having at least three states: a first state where the first and second hot-swap controllers are OFF; a second state where the first switch and a second switch are turned ON for normal operation; and a third state where the first and second switches have reached current limit; and
  a first timer that is initiated when the first hot-swap controller enters the third state, wherein the first and second switches are turned OFF when the first timer times out while the first hot-swap controller remains in current limit in the third state,
  wherein the control logic circuit of the first hot-swap controller includes at least one low-stress stage start switch, wherein the second hot-swap controller includes a control logic circuit including at least one low-stress stage start switch, wherein the control logic circuit of the first hot-swap controller implements the state diagram with a further state comprising a fourth state where all low-stress stage start switches are turned ON and all other switches are OFF, further comprising a second timer that is initiated when the first hot-swap controller enters the fourth state, wherein a fault signal is signaled when the first timer times out before the low-stress stage start switches successfully charge the load.

17. The controller of claim 16, wherein the current limit hysteresis circuit comprises a resistor and a current source between a current sense resistor and ground when the first switch is ON, the current limit hysteresis circuit adding a current to a current sensed by the current sense resistor when the second switch is turned OFF.

18. The controller of claim 16, wherein the current limiting circuit provides a control output to turn ON the second switch when the first switch is not in current limit and to turn OFF the second switch when the first switch is in current limit or the second switch is outside its safe operating area.

\* \* \* \* \*